US006825551B1

(12) United States Patent
Do Bento Vieira

(10) Patent No.: US 6,825,551 B1
(45) Date of Patent: Nov. 30, 2004

(54) METHOD FOR PACKAGING A SEMICONDUCTOR CHIP CONTAINING SENSORS AND RESULTING PACKAGE

(75) Inventor: Antonio Do Bento Vieira, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 40 days.

(21) Appl. No.: 10/070,080

(22) PCT Filed: Aug. 24, 2000

(86) PCT No.: PCT/FR00/02367

§ 371 (c)(1),
(2), (4) Date: Jul. 1, 2002

(87) PCT Pub. No.: WO01/17033

PCT Pub. Date: Mar. 8, 2001

(30) Foreign Application Priority Data

Sep. 2, 1999 (FR) .......................................... 99 11024

(51) Int. Cl.[7] .............................................. H01L 21/44
(52) U.S. Cl. ...................................... 257/678; 257/666
(58) Field of Search ................................ 257/666, 667, 257/668, 678, 734, 735, 737, 738, 777, 778, 779, 780, 781, 782, 783, 784, 787

(56) References Cited

U.S. PATENT DOCUMENTS

| | | | | |
|---|---|---|---|---|
| 5,773,886 A | * | 6/1998 | Rostoker et al. | 257/718 |
| 5,817,540 A | * | 10/1998 | Wark | 438/107 |
| 5,821,457 A | * | 10/1998 | Mosley et al. | 174/52.4 |
| 6,078,102 A | * | 6/2000 | Crane et al. | 257/730 |
| 6,078,502 A | * | 6/2000 | Rostoker et al. | 361/723 |

* cited by examiner

*Primary Examiner*—David Nhu
(74) *Attorney, Agent, or Firm*—Lisa K. Jorgenson; Jose Gutman; Fleit, Kain, Gibbons, Gutman, Bongini & Bianco P.L.

(57) ABSTRACT

A method of producing a package (30) for a semiconductor die (or chip) including a semiconductor die (20) having one or more bond pads on the top surface for providing terminals for one or more sensors (22) in the upper surface and a die carrier (32) including an opening (34) and one or more external terminals. The semiconductor die (20) upper surface is fixed on the die carrier (32) and each bond pad is coupled to a portion of the external terminals exposed at the die carrier (32) lower surface, for example, with weld points (42). A sealing ring (44,46) encapsulates the interface zone (40) and a coating material (48) encapsulates the die carrier (32) lower surface and a lower surface of the semiconductor die (20).

19 Claims, 4 Drawing Sheets

METHOD FOR PACKAGING A SEMICONDUCTOR CHIP CONTAINING SENSORS AND RESULTING PACKAGE

CROSS-REFERENCE TO RELATED APPLICATIONS

This application is the National Stage of International Application No. PCT/FR00/02367 filed on Aug. 24, 2000, which is based upon and claims priority from prior French Patent Application No. 9911024 filed Sep. 2, 1999, the entire disclosure of which in herein incorporated by reference.

BACKGROUND OF THE INVENTION

1. Field of the Invention

The present invention relates generally to packaging semiconductor dies and more particularly to a method for packaging a semiconductor die containing one or more sensors and to a package resulting in particular from this method.

2. Description of Related Art

Without limiting the scope of the present invention, the background of the present invention is described in connection with the packaging of semiconductor dies containing one or more optical sensors, which can be any sensors designed to detect any spectrum of light, including infrared. Accordingly, the present invention is applicable to the packaging of any semiconductor die containing one or more sensors, such as fingerprint sensors, where conventional packaging techniques and materials reduce the effectiveness of the sensors.

Semiconductor dies or integrated circuits containing optical sensors, unlike most semiconductor dies, must be packaged in such a way as to allow light to contact the optical sensors and motion sensors, but still protect these sensors from environmental contamination. This is also true for infrared sensors, such as those used in integrated circuit fingerprint sensors. As a result, the performance and sensitivity of optical and other sensors can be significantly diminished by contaminants and moisture introduced during the packaging process, or by contaminants, air bubbles, irregularities and deformities in the packaging material itself.

In addition, some packages for semiconductor dies containing sensors utilize a transparent plastic resin or epoxy resin.

The use of a transparent plastic resin or epoxy resin, however, introduces additional problems. First, the most commonly used agents to facilitate the molding of the package and increase the package's reliability cannot be used. Second, these transparent materials are harder to handle and clean out of the molds. Third, these materials are more expensive and require lengthy cure times (2 to 3 times that of a normal package).

Accordingly, there is a need for a method for packaging semiconductor dies containing one or more sensors that is durable, economical, efficient and effective. More specifically, the package should not significantly interfere with sensor performance while simultaneously protecting the sensors from foreign materials and contaminants.

SUMMARY OF THE INVENTION

The subject of the present invention is first of all a method for packaging a semiconductor die which comprises the steps of attaching a surface of a semiconductor die to a surface of a die carrier having external lead bonds or terminals, such that this die carrier does not extend in front of one or more sensors provided on the top surface of the semiconductor die and one or more bond pads on the top surface of the semiconductor die are coupled to one or more of the bond pads of said die carrier in an annular interface area formed between the top surface of the semiconductor die and a surface of said die carrier; encapsulating said interface area with a sealing ring; and encapsulating the bottom surface of the die carrier and a bottom surface of the semiconductor die with a packaging material.

According to an alternative embodiment of the invention, the method comprises the steps of: attaching a top surface of a semiconductor die to a bottom surface of a die carrier such that one or more sensors within the top surface of the semiconductor die are disposed below a first opening in the die carrier that is larger than the one or more sensors but smaller than the semiconductor die and an interface area is formed between said die and said die carrier where the top surface of the semiconductor die extends beyond the first opening in the die carrier and one or more bond pads on the top surface of the semiconductor die are coupled to one or more of the exterior terminals on the bottom surface of the die carrier; curing the semiconductor die attached to the die carrier; encapsulating the interface area with a sealing ring; curing the sealing ring; encapsulating the bottom surface of the die carrier and a bottom surface of the semiconductor die with a packaging material; and curing the packaging material.

According to the invention, the method may advantageously comprise the steps of: encapsulating an exterior portion of the interface area with a first sealing ring; curing the first sealing ring; encapsulating the bottom surface of the die carrier and a bottom surface of the semiconductor die with a packaging material; curing the packaging material; encapsulating an interior portion of the interface area with a second sealing ring; and curing the second sealing ring.

According to another alternative embodiment of the invention, the method comprises the steps of: attaching a bottom surface of a semiconductor die to a top surface of a recessed area of a pre-printed frame, the recessed area being larger than the semiconductor die, the semiconductor die having one or more bond pads on a top surface for providing terminals to one or more sensors within the top surface, and the pre-printed frame having one or more wire leads; curing the semiconductor die attached to the pre-printed frame; forming a dam to surround the recessed area to prevent a packaging material from entering the recessed area; curing the dam; forming wire bonds to couple each bond pad to a portion of one of the wire leads that is near the recessed area; encapsulating the wire bonds with a sealing ring; curing the sealing material; encapsulating the bottom surface of the pre-printed frame with the packaging material; and curing the packaging material.

According to the invention, the method may advantageously further comprise a step of applying a protective coating over the one or more sensors of the semiconductor die.

According to the invention, the method may advantageously furthermore comprise attaching a cap having a second opening larger than the sensors of the semiconductor die, the cap being attached to the top surface of the die carrier; and substantially encapsulating the cap with the packaging material.

Another subject of the invention is a semiconductor die package comprising a semiconductor die having one or more bond pads on a top surface for providing terminals to one or more sensors, in particular optical sensors, within the top surface; a die carrier which does not extend in front of said sensors and which has one or more bond pads comprising bond terminals and having external lead bonds, the bond pads of said die carrier and the bond pads of said die determining between them an annular interface area and being coupled in this area; a sealing ring encapsulating said interface area; and a packaging material encapsulating the bottom surface of the die carrier and a bottom surface of the semiconductor die.

According to the invention, the package may advantageously comprise a die carrier having a first opening larger than the one or more sensors but smaller than the semiconductor die and one or more external terminals; the top surface of the semiconductor die attached to the bottom surface of the die carrier such that the one or more sensors are disposed below the first opening and an interface area is formed where the top surface of the semiconductor die extends beyond the first opening in the die carrier and each bond pad is coupled to a portion of one of the external terminals that is exposed on the bottom surface of the die carrier; a sealing ring encapsulating the interface area; and a packaging material encapsulating the bottom surface of the die carrier and a bottom surface of the semiconductor die.

According to the invention, the sealing ring may advantageously comprise a first external sealing ring and a second internal sealing ring.

According to the invention, each bond pad is coupled to one of the external pads on the bottom surface of the die carrier by a solder bump.

According to the invention, the die carrier may advantageously comprise a substrate and each external terminal comprises a bond pad formed on a top surface of the substrate.

According to the invention, the die carrier may advantageously comprise a pre-printed frame and each external terminal comprises a wire lead.

According to the invention, the package may advantageously comprise a pre-printed frame having a recessed area which is larger than the semiconductor die and one or more wire leads, a bottom surface of the semiconductor die being attached to a top surface of the recessed area of the pre-printed frame; a wire bond coupling each bond pad to a portion of one of the external terminals near the recessed area; a dam surrounding the recessed area to prevent packaging material from entering the recessed area; a sealing material encapsulating each wire bond; and a package material encapsulating the bottom surface of the pre-printed frame.

According to the invention, the package may advantageously furthermore comprise a cap having a second opening similar in size to the first opening, the cap being attached to the top surface of the pre-printed wire frame and the packaging material substantially encapsulating said cap.

According to the invention, said sealing ring and/or said packaging material may advantageously comprise a thixotropic epoxy-based material.

According to the invention, the one or more sensors are covered with a protective layer.

According to the invention, the package may advantageously furthermore comprise a transparent encapsulation material in the first opening and on the top surface of the semiconductor die.

According to the invention, the package may advantageously furthermore comprise a lens disposed above the one or more sensors.

BRIEF DESCRIPTION OF THE DRAWINGS

The above and further advantages of the invention may be better understood by referring to the following description in conjunction with the appended drawings, in which.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not limit the scope of the invention.

The descriptions of the figures to follow discuss methods of packaging semiconductor dies containing sensors whose functionality and reliability depend on the fundamental characteristics of light traveling to or from the device. In addition, the packaging methods described below are equally applicable to other types of sensors, such as fingerprint sensors. The discussion centers around general flip chip or wire bonded attachments, but is not intended to limit the scope of the invention to these configurations, since the method of packaging may be used for any chip attachment configuration. Moreover, lenses and other focusing or filtering elements can be easily added to the packages described below.

Figures 1A, 1B, 1C:
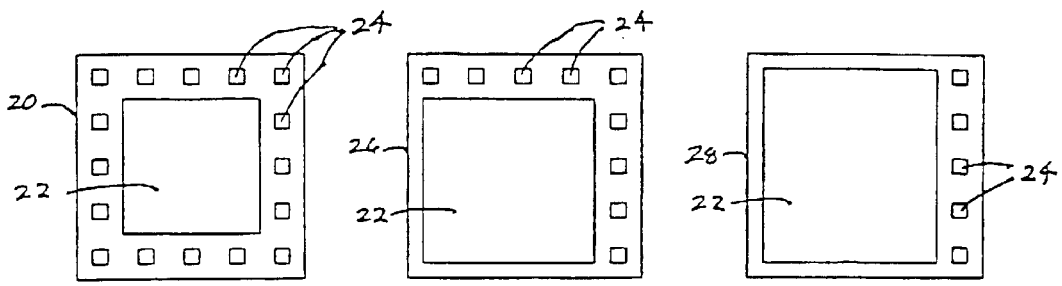
FIGS. 1A–1C depict a top view of a semiconductor die having one or more sensors in accordance with the present invention.

Turning now to FIG. 1A, a top view of a semiconductor die 20 having a quad bond pad row arrangement is depicted and will now be described. The semiconductor die 20 has a sensor area 22, which contains one or more sensors (not shown), and one or more bond pads 24. The one or more sensors (not shown) are typically optical sensors or sensors designed to detect any spectrum of light, including infrared. The one or more sensors (not shown) may also be fingerprint sensors or some other type of non-optical sensor. The sensor area 22, however, may also contain additional circuitry (not shown), such as control, memory, processing or other non-sensing circuits. The bond pads 24 are located between the sensor area 22 and the perimeter of the semiconductor die 20, and provide terminals to the one or more sensors (not shown) contained in the sensor area 22. The bond pads 24 may be arranged in a quad bond pad row arrangement (FIG.

1A), dual bond pad row arrangement 26 (FIG. 1B), or a single bond pad row arrangement 28 (FIG. 1C). In any case, the number and configuration of the bond pads 24 on the semiconductor die 20 may vary and are not limited by FIGS. 1A, 1B and 1C.

Now referring to FIG. 2, a top view of a package for a semiconductor die containing one or more sensors in accordance with a first embodiment of the present invention is denoted generally as 30 and will now be described. The package 30 comprises a semiconductor die 20 attached to a die carrier or substrate 32. The semiconductor die 20 has one or more bond pads 24 on the top surface in a quad bond pad row arrangement. As previously mentioned in reference to FIGS. 1A, 1B and 1C, the number and configuration of the bond pads 24 can vary. The substrate 32 has an opening 34, which is larger than the sensor area 22, but smaller than the semiconductor die 20 and the one or more bond pads 24. The opening 34 extends all the way through the substrate 32.

Figure 3:
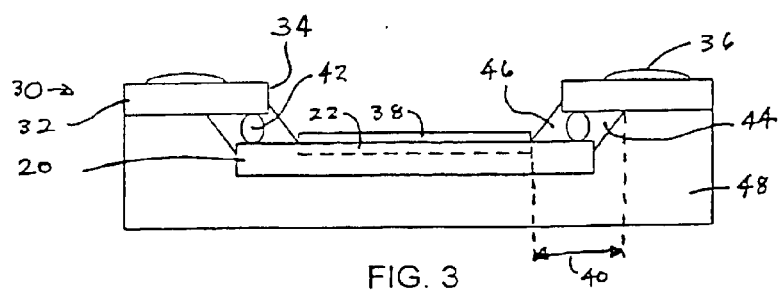
FIG. 3 depicts a cross sectional view of the package depicted in FIG. 2 in accordance with the first embodiment of the present invention.

The top surface of the semiconductor die 20 is attached to the bottom surface of the substrate 32 so that the sensor area 22 is disposed below the opening 34 and an interface area 40 (FIG. 3) is formed where the top surface of the semiconductor die 20 extends beyond the opening 34 in the substrate 32 and each bond pad 24 is coupled to one of the external terminals 36 with a solder bump 42 (FIG. 3).

Figure 2:
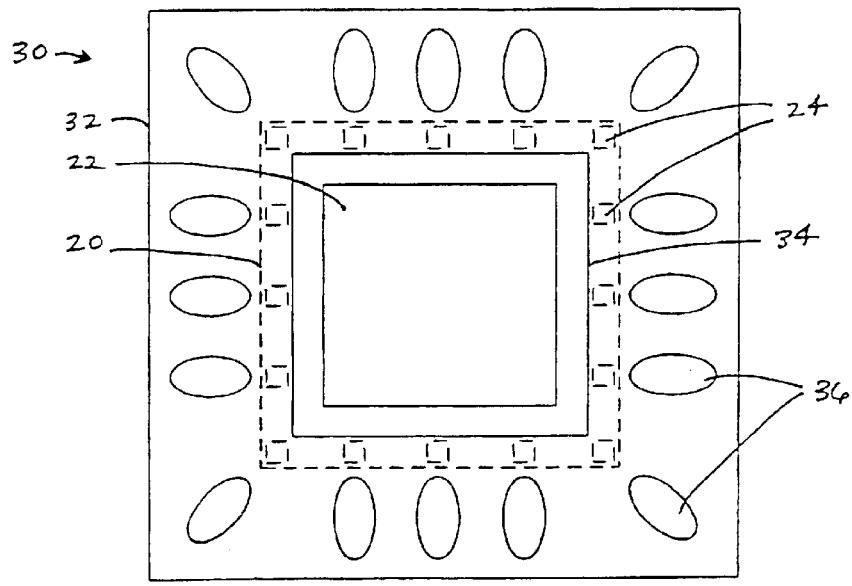
FIG. 2 depicts a top view of a package for a semiconductor die having one or more sensors in accordance with a first embodiment of the present invention.

Now referring to FIG. 3, a cross-sectional view of the package depicted in FIG. 2 is shown. As previously described, the package 30 comprises a semiconductor die 20 attached to a substrate 32. The semiconductor die 20 has a sensor area 22, which is preferably covered with a protective layer 38. The substrate 32 has an opening 34, which is larger than the sensor area 22, but smaller than the semiconductor die 20 and the one or more bond pads 24 (FIG. 2). The opening 34 extends all the way through the substrate 32.

The top surface of the semiconductor die 20 is attached to the bottom surface of the substrate 32 so that the sensor area 22 is disposed below the opening 34 and an annular interface area 40 is formed where the top surface of the semiconductor die 20 extends beyond the opening 34 in the substrate 32 and each bond pad 24 is coupled to one of the external terminals 36 with a solder bump 42. The external terminals 36 are strategically placed over the top surface of the substrate 32 to provide a physical connection to the bond pads 24 once the solder bumps 42 are re-flowed.

The interface area 40 is encapsulated with a sealing ring, which may be applied in a two stage process to form a first sealing ring 44 and a second sealing ring 46. The single sealing ring configuration may be used when the solder bumps 42 can be encapsulated while maintaining the required thermal cycle/shock performance, such as in low cost situations where lower reliability is acceptable. The two sealing ring configuration, however, provides increased reliability. The first sealing ring 44 provides good mechanical definition of the exposed sensor area 22 that results in mechanical accuracy, repeatability and reproducibility. The second sealing ring 46 provides higher reliability in terms of thermal cycle/shock performance and prevents failure mechanisms caused by cracked solder bumps 42 due to excessive stress induced by differences in the thermal coefficient of expansion of the first sealing ring 44, packaging material 48, and the substrate 32. Either way, the sealing rings 44 and 46 prevent any packaging material 48 from getting into the sensor area 22.

The first sealing ring 44 encapsulates the exterior portion of the interface area 40, whereas the second sealing ring 46 encapsulates the interior portion of the interface area 40. The first sealing ring 44 preferably comprises a high-purity, thixotropic epoxy-based non-flowing retaining dam material having a high glass transition temperature with a low coefficient of thermal expansion and an excellent thermal shock/cycle performance. The second sealing ring 46 preferably comprises a high-purity, high-flow underfilling material having a low coefficient of thermal expansion and an excellent thermal shock/cycle performance. If only one sealing ring is used, it should comprise a high-purity, thixotropic epoxy-based non-flowing retaining dam material having a high glass transition temperature with a low coefficient of thermal expansion and an excellent thermal shock/cycle performance.

The bottom surface of the substrate 32 and the bottom surface of the semiconductor die 20 are encapsulated with a packaging material 48. The packaging material 48 preferably comprises a high-purity, thixotropic epoxy-based encapsulant material having a low coefficient of thermal expansion and an excellent thermal shock/cycle performance.

Now referring to FIGS. 4A–4D, the method of manufacturing the package depicted in FIGS. 2 and 3 will be described. As will be readily appreciated by those skilled in the art, some of the steps described below may be modified or combined into a single step to produce an equivalent device. Accordingly, the present invention is not strictly limited by the order described or depicted in the following figures.

Figure 4A:
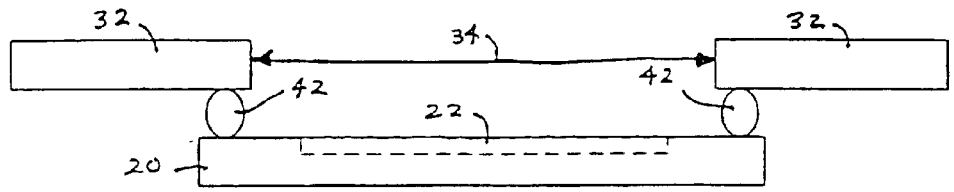
FIGS. 4A–4D depict, in cross sectional views, the method of producing the package depicted in FIGS. 2 and 3 in accordance with the first embodiment of the present invention.

Step One (FIG. 4A)

The top surface of the semiconductor die 20 is attached to the bottom surface of the die carrier or substrate 32 such that the sensor area 22 containing the one or more sensors within the top surface of the semiconductor die 20 is disposed below the opening 34 in the substrate 32. The opening 34 is larger than the sensor area 22, but is smaller than the semiconductor die 20. An annular interface area 40 (FIG. 3) is formed where the top surface of the semiconductor die 20 extends beyond the opening 34 in the substrate 32. Each bond pad 24 (FIG. 2) is coupled to one of the external terminals 36 (FIG. 2) that are exposed on the bottom surface of the substrate 32 with a solder bump 42. The assembly (substrate 32 and semiconductor die 20) is then cured.

Figure 4B:
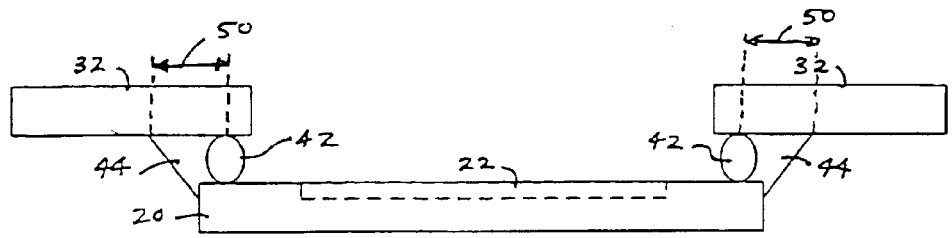

Step Two (FIG. 4B)

The exterior portion 50 of the interface area 40 (FIG. 3) is encapsulated with the first sealing ring 44. The first sealing ring is then cured.

Figure 4C:
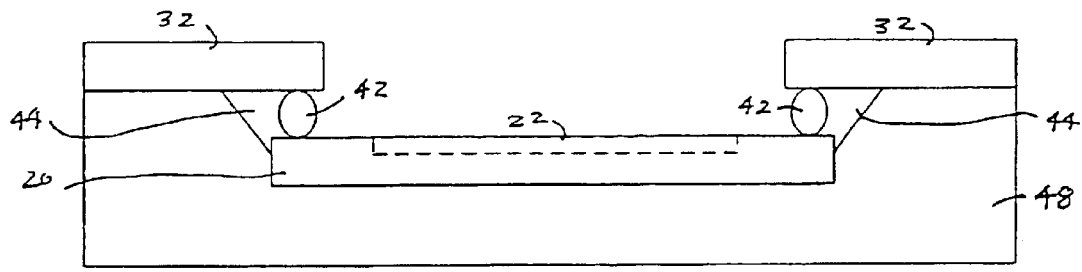

Step Three (FIG. 4C)

The bottom surface of the substrate 32 and the bottom surface of the semiconductor die 20 are encapsulated with a packaging material 48. The packaging material 48 is then cured.

Figure 4D:
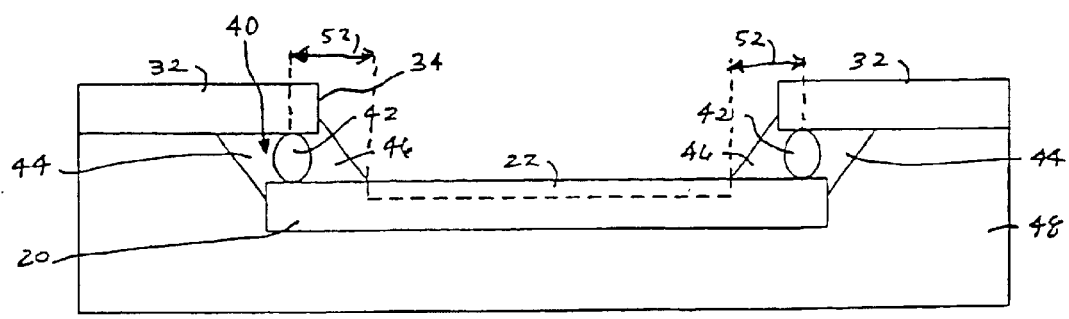

Step Four (FIG. 4D)

The interior portion 52 of the interface area 40 (FIG. 3) is encapsulated with a second sealing ring 46. The second sealing ring is then cured. Note that the first and second sealing rings 44 and 46 can be combined into a single sealing ring that encapsulates the interface area 40 (FIG. 3), thus eliminating step four.

Step Five (FIG. 3)

The protective layer 38 is formed on top of the sensor area 22 and the external terminals 36 are formed. A lens or filter may also be installed in or above the opening 34 (FIGS. 2 and 4A). The package is then preferably cleaned.

Now referring to FIGS. 5A–5F, the method of manufacturing a package in accordance with a second embodiment of the present invention will be described. In this embodiment, a pre-printed frame 60 is used as the die carrier, rather than the substrate 32 in FIGS. 2–4D. Pre-printed frames 60 are well known by those skilled in the art and typically contain one or more etched and stamped wire leads (not shown) and frame alignment holes (not shown).

Figure 5A:
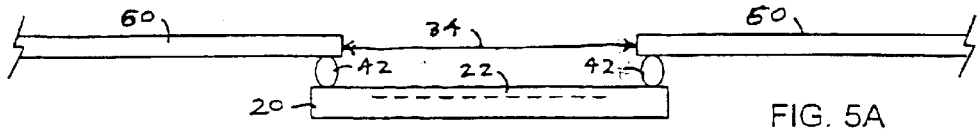
FIGS. 5A–5F depict, in cross sectional views, the method of producing a package for a semiconductor die having one or more sensors in accordance with a second embodiment of the present invention.

Step One (FIG. 5A)

The top surface of the semiconductor die 20 is attached to the bottom surface of the die carrier or pre-printed frame 60 such that the sensor area 22 containing the one or more sensors within the top surface of the semiconductor die 20 is disposed below the first opening 34 in the pre-printed frame 60. The first opening 34 is larger than the sensor area 22, but is smaller than the semiconductor die 20. An annular interface area 66 (FIG. 5D) is formed where the top surface of the semiconductor die 20 extends beyond the opening 34 in the preprinted frame 60. Each bond pad 24 FIGS. 1A, 1B or 1C is coupled to one of the external terminals or wire leads 74 (FIG. 5F) that are exposed on the bottom surface of the pre-printed frame 60 with a solder bump 42. The assembly (pre-printed frame 60 and semiconductor die 20) is then cured.

Figure 5B:
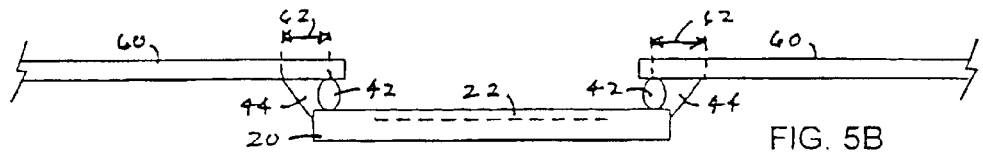

Step Two (FIG. 5B)

The exterior portion 62 of the interface area 66 (FIG. 5D) is encapsulated with the first sealing ring 44. The first sealing ring is then cured.

Figure 5C:
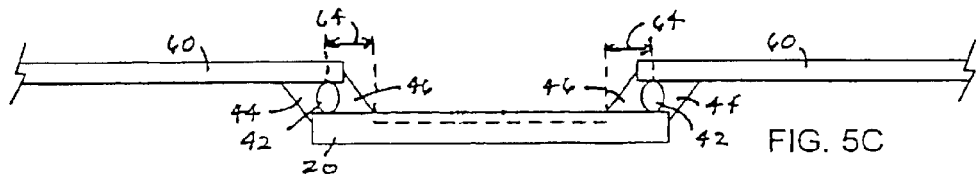

Step Three (FIG. 5C)

The interior portion 64 of the interface area 66 (FIG. 5D) is encapsulated with a second sealing ring 46. The second sealing ring is then cured. Note that the first and second sealing rings 44 and 46 can be combined into a single sealing ring that encapsulates the interface area 66 (FIG. 5D), thus eliminating step three.

Figure 5D:
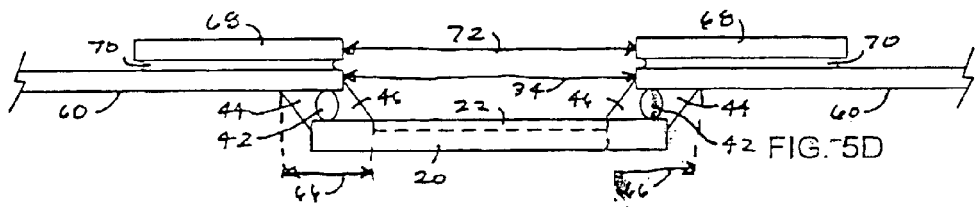

Step Four (FIG. 5D)

A cap 68 is attached to the top surface of the pre-printed frame 60 with an adhesive 70, such as a polymide adhesive. The cap 68 has a second opening 72 similar in size to the first opening 34 in the pre-printed frame 60. The cap 68 adds mechanical strength and stability to the package. The assembly is then cured.

Figure 5E:
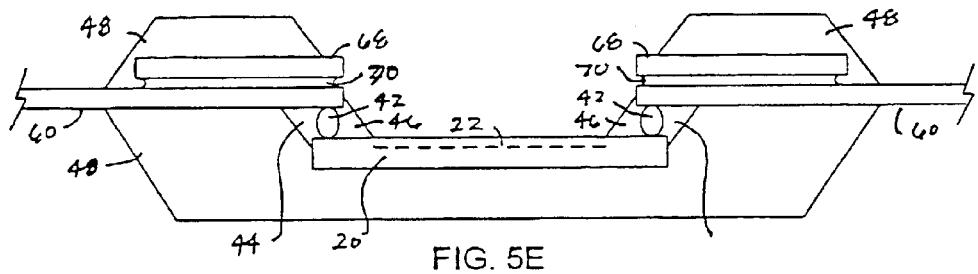
Figure 5F:
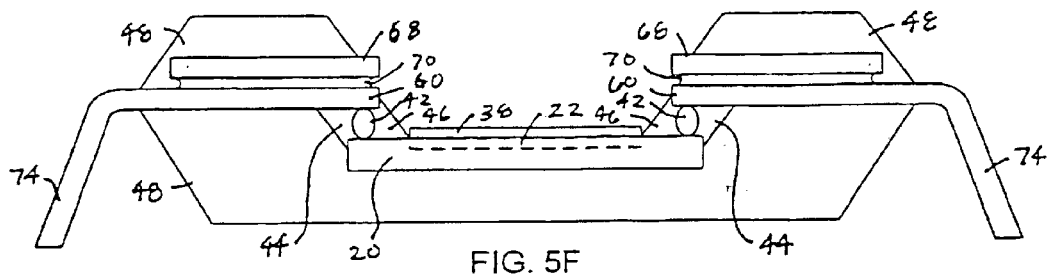

Step Five (FIG. 5E)

The bottom surface of the pre-printed frame 60 and the bottom surface of the semiconductor die 20 are encapsulated and the cap 68 is substantially encapsulated with a packaging material 48. The packaging material 48 is then cured.

Step Six (FIG. 5E)

The protective layer 38 is formed on top of the sensor area 22 and the external terminals or wire leads 74 are trimmed and formed. A lens or filter may also be installed in or above the first opening 34 or second opening 72 (FIG. 5D). The package is then preferably cured.

Now referring to FIGS. 6A–6F, the method of manufacturing a package in accordance with a third embodiment of the present invention will be described. In this embodiment, like FIGS. 5A–5F, a pre-printed frame 80 is used as the die carrier. This pre-printed frame 80, however, does not have a first opening 34 (FIG. 5D). Instead, the pre-printed frame 80 has a recessed area 82 that is larger than the semiconductor die 20. This arrangement provides a low-profile package.

Figure 6A:
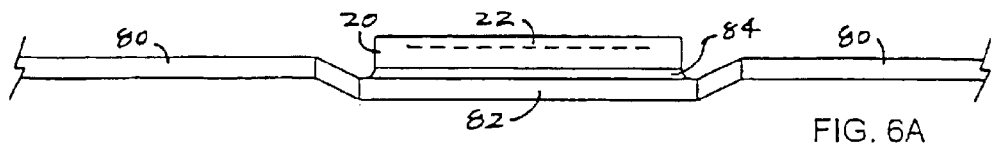
FIGS. 6A–6F depict, in cross sectional views, the method of producing a package for a semiconductor die having one or more sensors in accordance with a third embodiment of the present invention.

Step One (FIG. 6A)

The bottom surface of the semiconductor die 20 is attached to the top surface of the recessed area 82 of the pre-printed frame 80 with an adhesive 84, such as a polymide adhesive. The assembly (pre-printed frame 80 and semiconductor die 20) is then cured.

Figure 6B:
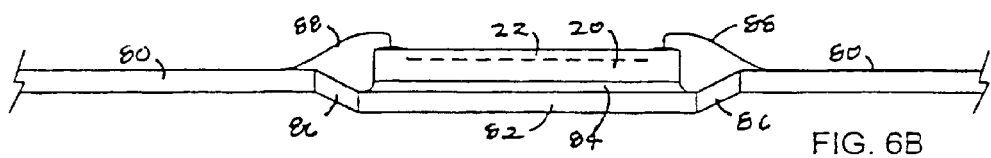

Steps Two and Three (FIG. 6B)

A dam 86 is formed to surround the recessed area 82 and prevent the packaging material 48 (FIG. 6E) from entering the recessed area 82 and the semiconductor die 20. The dam is then cured. Wire bonds 88 are formed to couple each bond pad 24 (FIGS. 1A, 1B and 1C) to a portion of one of the wire leads 98 (FIG. 6F) that is near the recessed area 82. Wire bonding is well known to those skilled in the art.

Figure 6C:
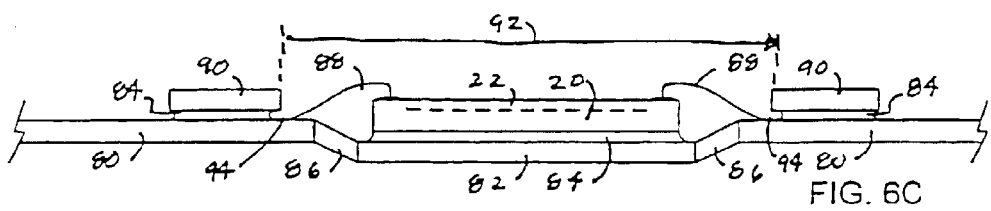

Step Four (FIG. 6C)

A cap 90 is attached to the top surface of the pre-printed frame 80 with an adhesive 84, such as a polymide adhesive. The cap 90 has an opening 92 above the portion of each of the exterior terminals 94 that is near the recessed area 82, the dam 86 surrounding the recessed area 82, and the recessed area 82. The cap 68 adds mechanical strength and stability to the package. The assembly is then cured.

Figure 6D:
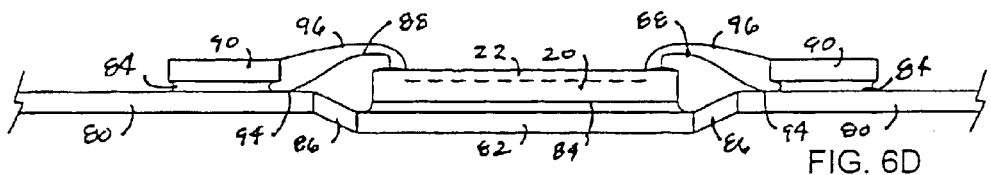

Step Five (FIG. 6D)

The wire bonds 88 are encapsulated with a sealing material 96. The sealing material 96 is then cured.

Figure 6E:
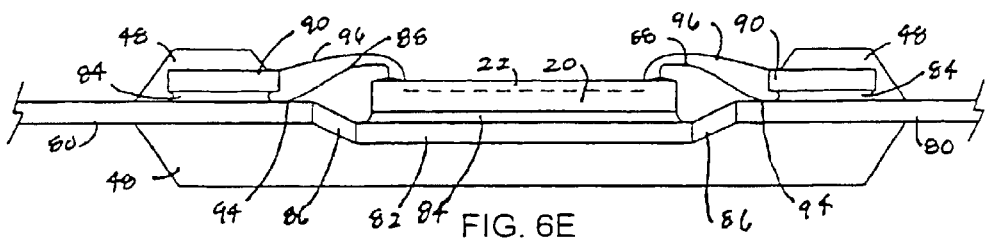

Step Six (FIG. 6E)

The bottom surface of the pre-printed frame 80, the dam 86 and the recessed area 82 are encapsulated and the cap 90 is substantially encapsulated with a packaging material 48. The packaging material 48 is then cured.

Figure 6F:
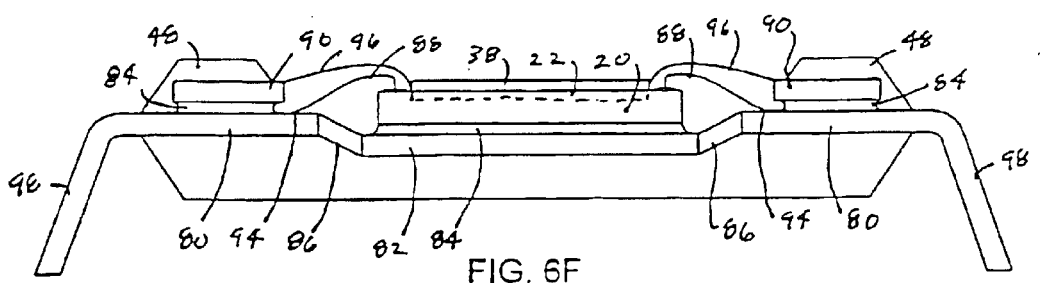

Step Six (FIG. 6F)

The protective layer 38 is formed on top of the sensor area 22 and the external terminals or wire leads 98 are trimmed and formed. A lens or filter may also be installed in or above the opening 92 (FIG. 6C). The package is then preferably cleaned.

Although preferred embodiments of the invention have been described in detail, it will be understood by those skilled in the art that various modifications can be made therein without departing from the spirit and scope of the invention as set forth in the appended claims.

What is claimed is:

1. A semiconductor die package, comprising:
   a semiconductor die having one or more bond pads on a top surface for providing terminals to one or more sensor, in particular optical sensors, within the top surface;
   a die carrier which does not extend in front of said sensors and which has one or more bond pads comprising bond terminals and having external lead bonds, the bond pads of said die carrier and the bond pads of said die determining between them an annular interface area and being coupled in this area;
   a sealing ring encapsulating said annular interface area; and
   a packaging material encapsulating the bottom surface of the die carrier and a bottom surface of the semiconductor die.

2. The semiconductor die package according to claim 1, wherein the die carrier has a pre-printed frame and each external terminal comprises a wire lead.

3. The semiconductor die package according to claim 2, further comprising:
   a cap having a second opening similar in size to a first opening, the cap being attached to the top surface of the pre-printed wire frame and the packaging material substantially encapsulating said cap.

4. The semiconductor die package according to claim 3, wherein the cap is attached to the pre-printed frame by a polymide adhesive.

5. The semiconductor die package according to claim 1, wherein the die carrier has a first opening larger than the one or more sensors but smaller than the semiconductor die and has one or more external terminals, the top surface of the semiconductor die being attached to the bottom surface of the die carrier such that the one or more sensors are disposed below the first opening and an interface area is formed where the top surface of the semiconductor die extends beyond the first opening in the die carrier and each bond pad is coupled to a portion of one of the external terminals that is exposed on the bottom surface of the die carrier, and the semiconductor die package further comprising:

a sealing ring encapsulating the interface area; and a packaging material encapsulating the bottom surface of the die carrier and a bottom surface of the semiconductor die.

6. The semiconductor die package according to claim 5, wherein the sealing ring comprises a first external sealing ring and a second internal sealing ring.

7. The semiconductor die package according to claim 5, wherein said sealing ring and/or said packaging material comprise a thixotropic epoxy-based material.

8. The semiconductor die package according to claim 5, wherein each bond pad is coupled to one of the external pads on the bottom surface of the die carrier by a solder bump.

9. The semiconductor die package according to claim 5, wherein the die carrier comprises a substrate and each external terminal comprises a bond pad formed on a top surface of the substrate.

10. The semiconductor die package according to claim 5, wherein the one or more sensors are covered with a protective layer.

11. The semiconductor die package according to claim 5, further comprising:

a transparent encapsulation material in the first opening and on the top surface of the semiconductor die.

12. The semiconductor die package according to claim 5, further comprising:

a lens disposed above the one or more sensors.

13. The semiconductor die package according to claim 1, further comprising:

a pre-printed frame having a recessed area which is larger than the semiconductor die and having one or more wire leads, a bottom surface of the semiconductor die being attached to a top surface of the recessed area of the pre-printed frame;

a wire bond coupling each bond pad to a portion of one of the external terminals near the recessed area;

a dam surrounding the recessed area to prevent packaging material from entering the recessed area;

a sealing material encapsulating each wire bond; and a package material encapsulating the bottom surface of the pre-printed frame.

14. The semiconductor die package according to claim 13, further comprising:

a cap having a second opening similar in size to a first opening, the cap being attached to the top surface of the pre-printed wire frame and the packaging material substantially encapsulating said cap.

15. The semiconductor die package according to claim 14, wherein the cap is attached to the pre-printed frame by a polymide adhesive.

16. The semiconductor die package according to claim 13, wherein said sealing ring and/or said packaging material comprise a thixotropic epoxy-based material.

17. The semiconductor die package according to claim 13, wherein the one or more sensors are covered with a protective layer.

18. The semiconductor die package according to claim 13, further comprising:

a transparent encapsulation material in a first opening and on the top surface of the semiconductor die.

19. The semiconductor die package according to claim 13, further comprising:

a lens disposed above the one or more sensors.

* * * * *

UNITED STATES PATENT AND TRADEMARK OFFICE
CERTIFICATE OF CORRECTION

PATENT NO. : 6,825,551 B1
DATED : November 30, 2004
INVENTOR(S) : Antonio Do Bento Vieira It is certified that error appears in the above-identified patent and that said Letters Patent is hereby corrected as shown below:

Column 8,
Line 62, change "opening," to -- opening in the die carrier, --.

Column 10,
Line 18, change "opening," to -- opening in the die carrier, --.
Line 32, change "opening and" to -- opening in the die carrier and --.

Signed and Sealed this

Sixteenth Day of August, 2005

JON W. DUDAS
*Director of the United States Patent and Trademark Office*